United States Patent [19]

Ochiai

[11] Patent Number: 4,759,490

[45] Date of Patent: Jul. 26, 1988

[54] METHOD FOR SOLDERING ELECTRONIC COMPONENTS ONTO A PRINTED WIRING BOARD USING A SOLDER PASTE

[75] Inventor: Masayuki Ochiai, Kawasaki, Japan

[73] Assignee: Fujitsu Limited, Kanagawa, Japan

[21] Appl. No.: 109,791

[22] Filed: Oct. 16, 1987

[30] Foreign Application Priority Data

Oct. 23, 1986 [JP] Japan .................. 61-250756

[51] Int. Cl.$^4$ .................. B23K 31/02; B23K 35/363
[52] U.S. Cl. .................. 228/124; 228/207; 228/224; 228/226; 228/238; 228/248; 148/23
[58] Field of Search ........ 228/123, 124, 188, 205–207, 228/223, 224, 226, 238, 248; 148/123

[56] References Cited

U.S. PATENT DOCUMENTS

| | | | |
|---|---|---|---|
| 4,504,007 | 3/1985 | Anderson, Jr. et al. | 228/248 |
| 4,650,108 | 3/1987 | Gallagher | 228/124 |

FOREIGN PATENT DOCUMENTS

2042370 10/1973 Fed. Rep. of Germany ...... 228/248

*Primary Examiner*—Nicholas P. Godici
*Assistant Examiner*—Samuel M. Heinrich
*Attorney, Agent, or Firm*—Armstrong, Nikaido, Marmelstein & Kubovcik

[57] ABSTRACT

A soldering method using a solder paste composed of solder alloy powder and soldering flux comprising rosin, thixotropic agent, activator, organic solvent and azobis compound such as 1,1′-azobis (cyclohexane-1-carbonitrile) as a free radical generator. The 1,1′-azobis (cyclohexane-1-carbonitrile) generates free radicals of cychlohexane-1-carbonitrile when heated in soldering, and the generated free radicals urge the activator to liberate hydrogen halide which enhances a removing effect of oxide film over a metal surface to be soldered. The azobis compound contributes to diminish the amount of activator and, consequently, hydrogen halide in the flux. The viscosity of the solder paste does not vary for a long time, which results in allowing the solder paste have a long shelf life. Since generation of the free radical is not decreased even though a soldering temperature decreased, which results in increasing solderability for low temperature soldering.

15 Claims, 5 Drawing Sheets

METHOD FOR SOLDERING ELECTRONIC COMPONENTS ONTO A PRINTED WIRING BOARD USING A SOLDER PASTE

BACKGROUND OF THE INVENTION

1. Field of the Invention

The present invention relates to a soldering method for mounting electronic components on a printed circuit board using a solder paste patterned on the circuit board. Particularly, the present invention relates to improvement of soldering flux which is applicable in wide range of soldering temperature, and enables to provide a low temperature solder paste for mounting semiconductor chips.

2. Description of the Prior Art

Recently, electronic components including semiconductor chips are mounted on a printed circuit board by soldering using a solder paste which is patterned on the printed circuit board applying various technology of thick film circuit such as silk screen printing, for example. Then, circuit elements are positioned on respective positions to be soldered, and the printed circuit board is heated in an oven to solder the circuit elements.

In such case, it is desirable to prepare several kinds of solder paste each including solder alloy powder having different melting points. They are properly used to solder various circuit elements on the circuit board. Especially, it is necessary to use a low temperature solder paste for soldering semiconductor chips in order to prevent deterioration of the chips. Usually, semiconductor chips are soldered using a low temperature solder paste after all other circuit elements such as capacitors or resistors have been mounted. Such soldering method utilizing the difference of melting point of solder is called in the art as step soldering.

The solder paste is composed of powder of solder metal kneaded with flux. The melting point of the solder paste is determined by the melting point of solder powder, which is determined by mixing rate of content materials such as lead, tin, gallium, indium etc. The flux is used for removing oxide films on the surface of the metal to be soldered and for preventing oxidation of the solder during soldering operation.

It is necessary to prepare various fluxes suitable for respective solder powders. Flux includes an activator which has a function to reduce and eliminate the oxide film covering the surface of soldering region. Usually, amine hydrogen halide is used, as an activator for liberating hydrogen halide by heat processing for soldering. Ordinary activator cannot operate sufficiently if it is applied in small quantity especially when the activator is used for low temperature soldering. Accordingly, diethylen amine hydrogen chloride of 0.3 weight percent of chlorine is usually added to the flux, but this amount often causes a deterioration of the soldered portion.

If the solder paste is stored for a long time, it increases its viscosity and becomes unsuitable for screen printing. Therefore, the present state-of-art solder paste has a shelf life, that means a period of time during which it should be used. The shelf life for ordinary high melting point solder paste is less than a week, however, the shelf life for low melting point solder paste becomes shorter as the melting point becomes low. And a solder paste having a melting point of 117° C., for example, which is suitable for soldering semiconductor chips has a very short shelf life of only on day.

The short shelf life is very inconvenient for practical use, and it is a defect for soldering works of printed circuit board manufacturing. Even within a period of the shelf life, the solder paste having short shelf life varies its characteristics, such as hardness or viscosity for example, from hour to hour. Accordingly, it must be done very carefully to handle and preserve the solder paste. In many work shops of the printed circuit board manufacturing, the solder paste has to be prepared daily, and it is kept in refrigerator to maintain constant characteristics of the solder paste. Moreover, it is necessary to prepare various kinds of flux suitable for each of different melting point solder. It has been a very troublesome work for the workshops.

Even though the solder paste is preserved carefully, deviation of thickness of the silk screened pattern of solder paste often occurs, it is attributed to the variation of characteristics of the solder paste, and reliability of soldering is decreased. These are ascribed to the short shelf life.

SUMMARY OF THE INVENTION

It is an object of the present invention, therefore, to extend the shelf life of the solder paste.

It is another object of the present invention is to provide a flux which is usable in a wide range of melting temperature of solder.

It is further object of the present invention to improve solderability of solder paste.

It is still another object of the present invention to improve reliability of soldering.

It is still further object of the present invention to make the handling and preservation of solder paste easy.

It is yet another object of the present invention to provide a low melting point solder paste suitable for soldering semiconductor chips on a printed circuit board.

These objects are attained by using a solder paste which includes a flux comprising rosin, thixotropic agent, and an activator consisting of amine hydrogen halide with organic solvent and azobis compound free radical generator, which liberates hydrogen halide from the activator.

Other radical generators can be considered, however, in this embodiment of the present invention, 1,1'-azobis(cyclohexane-1-carbonitrile) is added to the flux as a radical generator. When the radical generator is heated during soldering, it generates free radicals of cyclohexane-1-carbonitrile. This free radical urges hydrogen halide to liberate from the activator, and enhances the effect to remove oxide film over the metal surface to be soldered. Soldering at low temperature becomes easy, because the hydrogen halide liberated by the free radicals increases more than the prior art flux. This feature enables to reduce the necessary amount of activator in the conventional paste, and prevents corrosion of soldered parts. So, the reliability at soldered parts are increased.

Moreover, above new flux of the present invention can be applied to solder in wide range of melting temperature. So, it becomes very easy to prepare various solder pastes having various melting points using the same flux.

Further, by adding 1,1'-azobis(cyclohexane-1-carbonitrile), it has been found that the shelf life of the solder paste is extended up to 20 days for low temperature solder paste. The use of the solder paste by the present invention, therefore, increases the quality and reliability of the printed circuit board.

DESCRIPTION OF THE PREFERRED EMBODIMENTS

Generally, melting point of solder is varied with content metals mixed in the solder. Though low melting point solders are provided, they can not be directly used for soldering, because it is necessary to remove oxide film formed on the surface of the soldering region, and protect the surface from oxidation during the soldering.

Therefore, the most important matter is to provide a proper flux suitable for desired soldering temperature. In the present state-of-the-art technology, the flux loses its activity when the soldering temperature decreases. So, it becomes difficult to realize a soldering at low temperature in the air.

Figure 1:
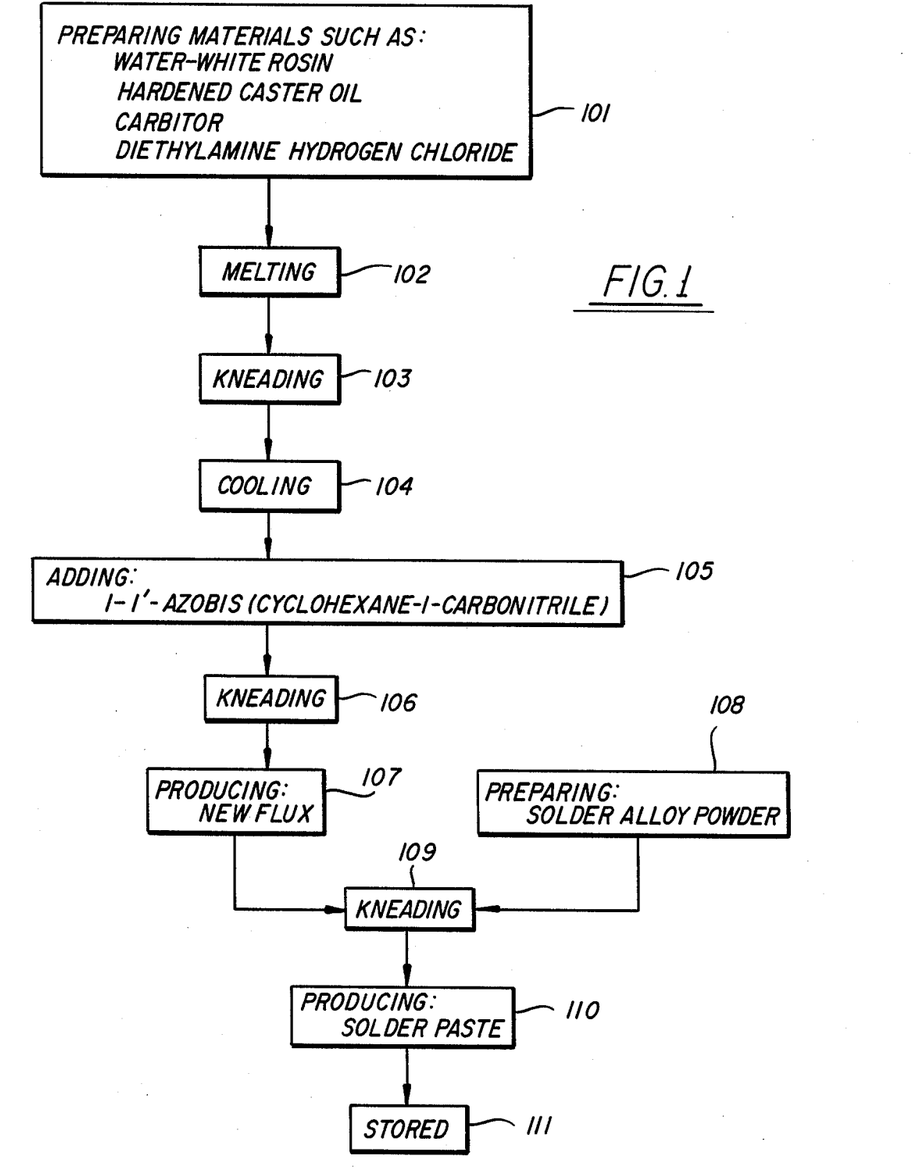
FIG. 1 is a block diagram illustrating the manufacturing process of the solder paste by the present invention.

FIG. 1 shows a process for preparing the solder paste of the present invention. This process is similar to those for preparing ordinary solder paste. In the following description, numerals in brackets corresponds to the reference numerals designated in FIG. 1. First, flux material (101) that is a mixture of water-white rosin, hardened caster oil, carbitor and diethylamine hydrogen chloride are put into a crucible. They are all conventional ones used for preparing ordinary solder flux. An embodiment of their mixing rate is as follows:
water-white rosin—52,
hardened caster oil—2,
carbitor—35 and
dietylamine hydrogen chloride—1 in Wt % (weight percent), respectively.

Then, they are heated and melted (102) at a temperature of 80° C., for example. When they are melted, they are kneaded (103) by a kneader to form a paste. These are well known processes in the art.

In the above embodiment, carbitor of 35 part is added as the solvent to the water-white rosin of 52 part, the hardened caster oil of 2 part is added as the thixotropic agent. These content ratio may be varied in some extent, for example, rosin may be varied from 45% to 75%, caster oil may be less than 5%, dietylamine hydrogen chloride may be less than 3% and carbitor may be varied from 15% to 55% (balance weight percent of other contents of the flux). As the activator, diethylamine or triethylamine hydrogen chloride is useful. These are known mixtures in the art.

Figure 2A:
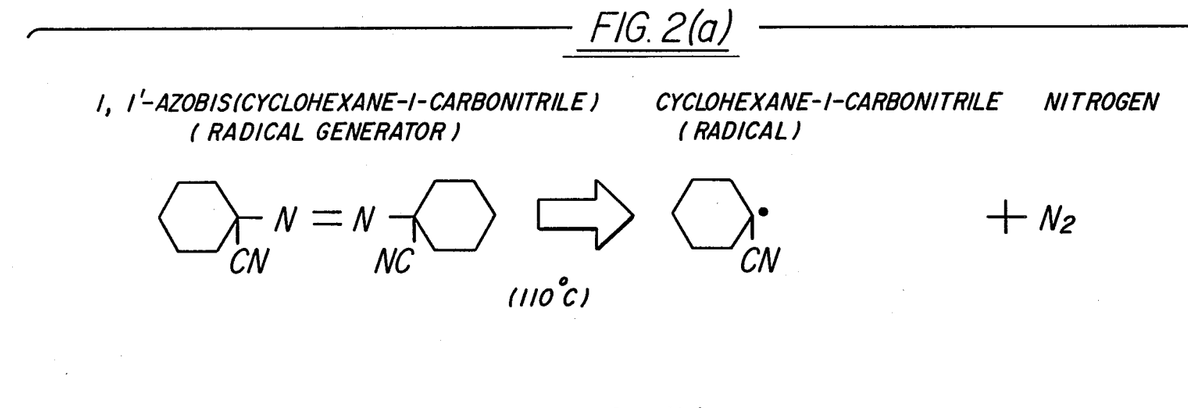
FIGS. 2(a) and 2(b) are schematic diagrams concerning to the chemical reaction of amine hydrogen chloride activator and 1,1'-azobis(cyclohexane-1-carbonitrile) free radical generator.

Most important feature of the present invention is to add an azobis compound as a free radical generator. In this embodiment, 10 Wt % of 1,1'-azobis (cyclohexane-1-carbonitrile) is added; wherein this content ratio may be also varied in extent as 1 to 20 Wt %. This material is abbreviated as "azobis" hereinafter for the sake of simplicity, and its chemical structure is shown in FIG. 2(a). After cooling (104) down to room temperature, azobis is added (105) to the paste of flux which is prepared in a manner described above and kneaded (106) again to form a new flux (107).

Then, solder alloy powder (108) of 200-325 mesh having desired melting point is added and kneaded (109) again. The mixing rate of the solder powder in total of the solder paste is 88 Wt %, for example. Thus, the solder paste (110) of the present invention is prepared. The solder paste can be stored (111) until it is used. The solder paste described above is suitable for silk screen printing. But the hardness or viscosity of the solder paste can be varied by varying the mixing ratio. So, it will be obvious that it is possible to provide a solder paste suitable for any other kind of application.

It has been found that above described new flux is applicable for wide range of solderling temperature. So, only one flux is enough for preparing various kinds of solder paste having different melting point respectively. This is a great merit of the new flux of the present invention in comparison with prior art solder flux. As described before, the melting point of the solder is varied by the choice of metals and mixing rate of them. This is a well known technology in the art, and since it is not explicitly related to the present invention, further description is omitted for the sake of simplicity.

Figure 2B:
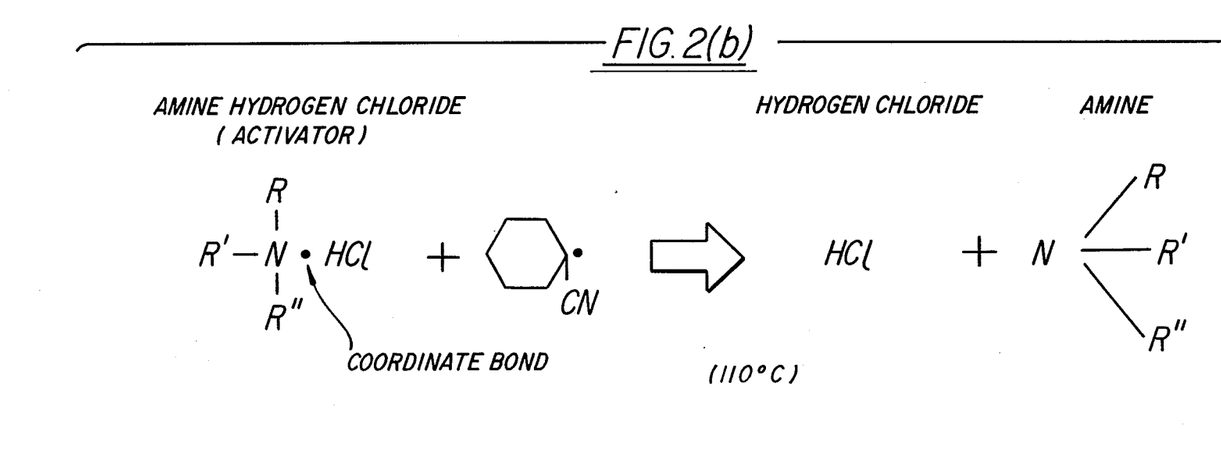

FIGS. 2(a) and 2(b) show chemical reaction considered to occur in the flux of the present invention during soldering operation. The azobis added into prior art flux operates as a radical generator. When it is heated higher than 110° C., it generates free radicals of cyclohexane-1-carbonitrile as shown in FIG. 2(a). This radical is abbreviated hereinafter simply as "radical" or "free radical". The quantity of the free radical generator azobis is not critical, but when it exceeds 10 weight percent in total amount of flux, the amount of generated nitrogen becomes excessive and thereby wettability of the solder becomes poor.

Generally, amine hydrogen chloride is an activator which liberates hydrogen chloride (HCl) when it is heated. The liberated hydrogen chloride removes the oxide films from the surface of soldering region. The liberation of hydrogen chloride decreases as the temperature decreases. This is a reason why ordinary flux loses its activity when it is used for low temperature soldering. But as shown in FIG. 2(b), when azobis is added, the free radicals generated from azobis break coordinate bond between amine and the hydrogen chloride. So, the liberation of hydrogen-chloride from the activator is enhanced. Many of liberated hydrogen chloride is generated even in low temperature, and hence, the activity of the flux is not decreased when it is used for low temperature soldering.

Such assumption is supported by following experiments. The wetting time of the solder paste at various temperature is measured with a meniscograph. Namely, one end of a predetermined sized copper ribbon is vertically immersed into melted solders. At first the solder surface goes down along the surface of the ribbon due to surface tension. But soon the surface of the solder begins to go up along the ribbon wetting its surface.

And finally, the border of the solder on the side wall of the ribbon creeps up higher than the surface of the solder. The wetting time is determined as a time period, between when the bar is dipped into the solder and the time when the border of the solder comes back to the same level of the solder surface.

Figure 3:
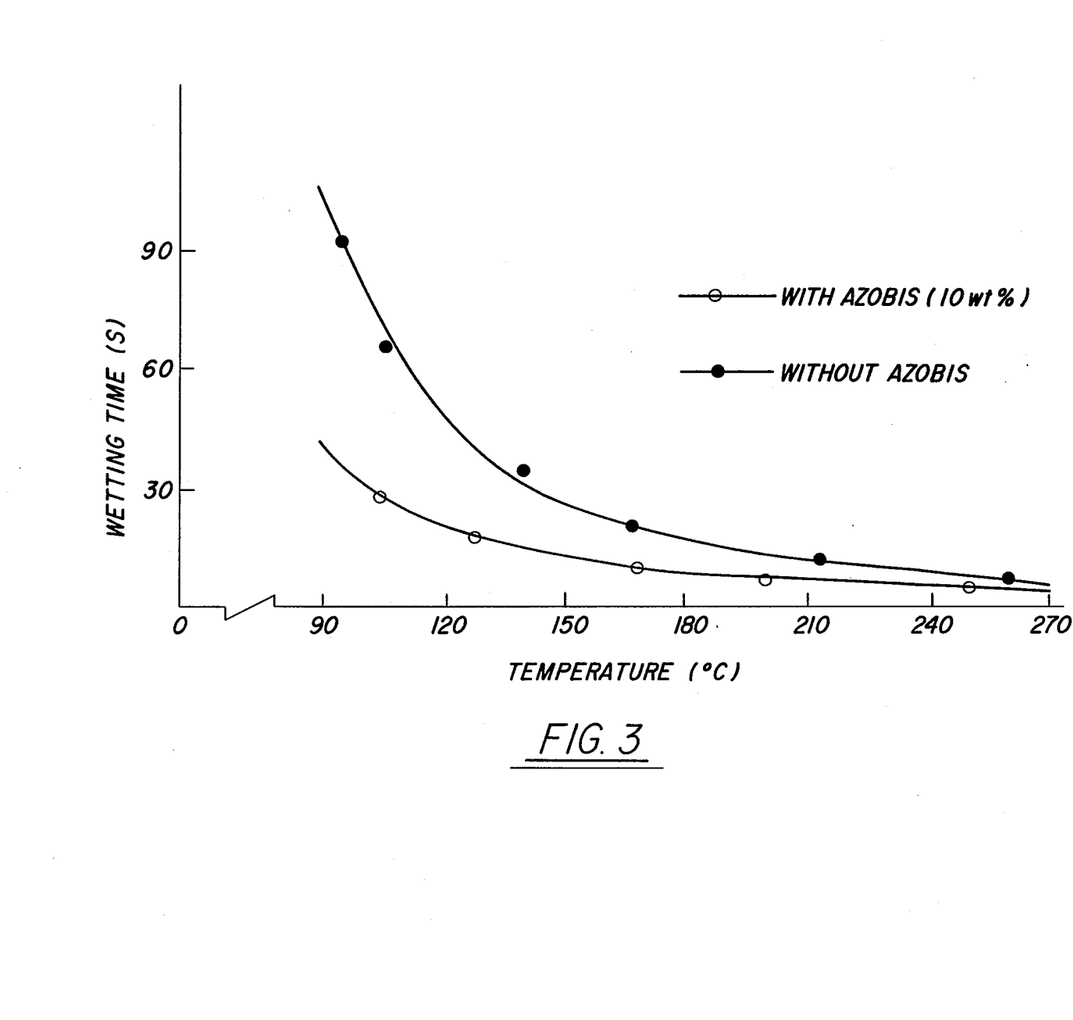
FIG. 3 is experimental plots of wetting time of the solder paste against temperature, comparing the activity of flux including azobis or not.

FIG. 3 is an experimental result comparing the activity of flux which includes the azobis with the one which does not include azobis. In the figure, ordinate indicates the wetting time in seconds, and abscissa indicates temperature during soldering, in °C. The curves connecting solid circles and white circles represent respectively the data of flux without and with azobis.

As can be seen in FIG. 3, the wetting time decreases as the temperature becomes high in both cases that the flux includes azobis and not include azobis. This is assumed that, the liberation of hydrogen chloride increases as the temperature becomes high. But as the temperature goes down, the activity of the flux without azobis (solid circles) decreases rapidly. On the other hand, the flux with azobis (white circles) maintains its activity higher than the flux without azobis. This means that the flux including azobis as a radical generator is applicable to lower temperature than ordinary flux which does not include azobis. The flux of the present invention, therefore, is capable of forming a low melting point solder paste such as a paste including In-Sn alloy solder.

FIG. 3 also teaches that, if both solder pastes are compared to each other at the same temperature, the solder paste including azobis has higher wettability compared with that of ordinary solder paste which does not include azobis, because the wetting time of solder paste including azobis is smaller than that of the solder paste which does not include azobis.

As described before, the viscosity of prior art solder paste varies from time to time, especially when low melting point solder paste is used. This decreases uniformity and reproducibility of thickness of solder paste coating the soldering area, wettability of solder, and decreases the reliability of soldering. But it has been found that, when radical generator of azobis is added into the flux, the solder paste is not hardened even after it is stored for six months. This means that the shelf life of the solder paste of the present invention has been elongated to a greater extent. Therefore, the solder paste of the present invention is suitable for screen printing assuring high reliability of the soldered part.

Figure 4:
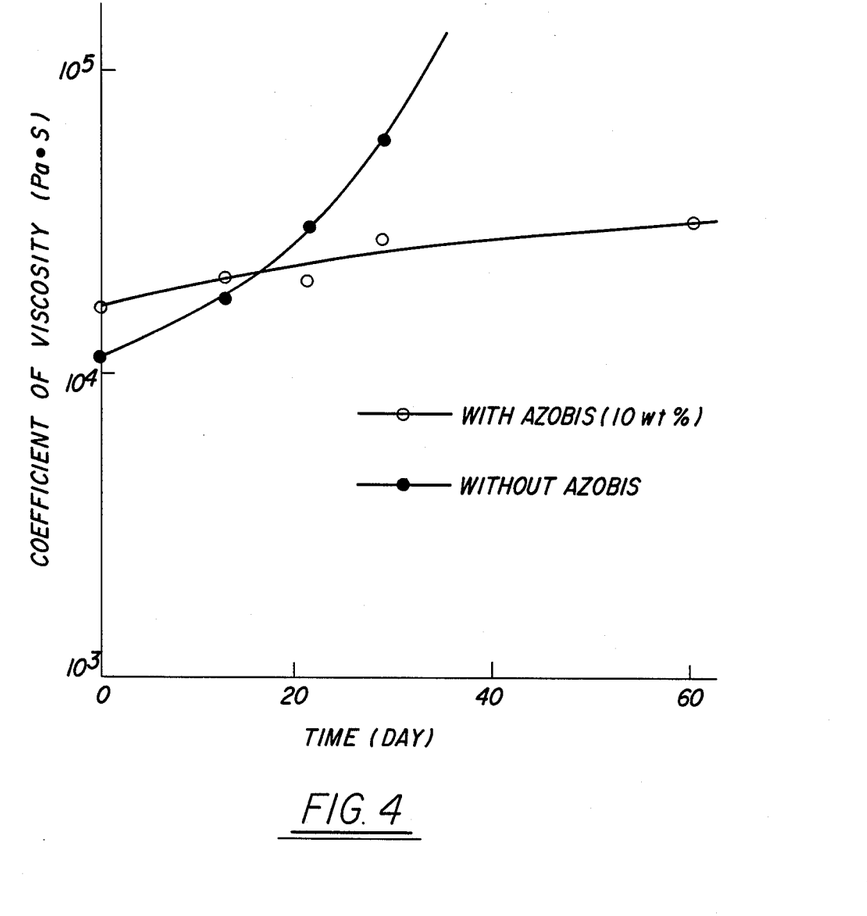
FIG. 4 is experimental plots of viscosity of the solder paste against time.

In FIG. 4, the change of viscosity of the soldering paste with time is shown. In the figure, a curve connecting solid circles shows the variation of viscosity of a prior art solder paste which does not include azobis. While a curve connecting white circles shows the variation of viscosity of a solder paste of the present invention. As can be seen in the figure, the viscosity of a solder paste comprising azobis radical generator hardly changes for a few months, while the viscosity of prior art solder pastes varies very soon.

A Japanese Patent No. 56-32079 discloses a solder flux using organic compound including an unstable atomic radical as an activator. In this solder paste, as in the case of conventional activator, the activator sets to liberate halogen atoms at the soldering temperature, and the liberated halogen atoms reduce and remove the oxide film. The liberation of the halogen atoms is urged by temperature, therefore, the generation of halogen atoms and hence the activity of the flux is decreased when the temperature is decreased.

On the contrary, operation of the flux of the present invention is considered as follows. The radical generator of the present invention does not have the function as the activator, but it shows a characteristics of generating hydrogen halide when it meets to the amine hydrogen halide. Namely, the radical generator generates free radicals when it is heated up to the soldering temperature. The free radical contributes to break the coordinate bond between amine and hydrogen halide included in the activator. This results in reduction of the oxide film. Therefore, the activation of the activator is not directly urged by temperature, but it is accelerated by the increase of free radicals. The decrease of the free radicals from the radical generator is not so much compared to the decrease of liberated halogen atoms from the activator when the temperature is decreased. So the activity of the flux of the present invention is maintained to a lower temperature compared to prior are flux.

Above consideration is but an assumption. But regardless the theoretical explanation, the solder paste of the present invention showed superior features compared with any other flux or solder paste of the prior art.

The activator is enhanced its effect by free radicals generated by the radical generator to an extent more than it is activated by temperature, therefore, quantity of the activator to be included in the flux can be reduced. This provides additional effect to prevent erosion of the soldered parts by remaining activator. So the reliability of the soldered part is more increased. Moreover, azobis is a stable compound at normal temperature, so the characteristics of the new flux is stable, and hence the shelf life is extended.

Next, a method of step soldering which is applicable to printed circuit board fabrication will be described briefly. FIGS. 5(a)-5(d) are schematic cross sectional views illustrating the process steps for the step soldering.

Figure 5A:
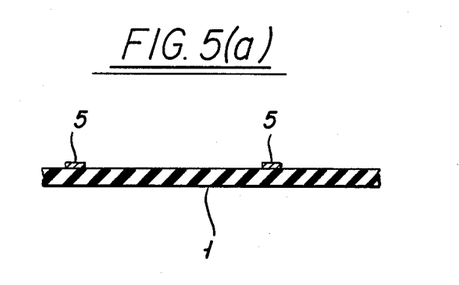
FIGS. 5(a)-5(d) are schematic diagrams illustrating the process steps for soldering IC chips and other components on a printed circuit board with a low melting point solder paste and a high melting point solder paste of the present invention.

First, a first solder paste that has relatively high melting point of 183° C., for example, prepared by a method as described above is used. As shown in FIG. 5(a), a pattern 5 of solder paste is formed on the surface of the printed circuit board 1 at portions where electronic devices are to be soldered. A silk screen printing is applicable for the patterning of the solder paste.

Figure 5B:
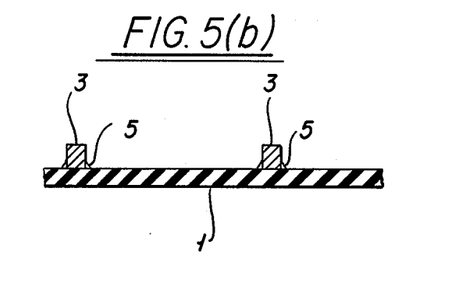

Next, as shown in FIG. 5(b), first electronic circuit components 3 which can be soldered at relatively high temperature, such as chip capacitors or resistors, are placed on the position to be soldered. This can be done using ordinary loading machine. Then, the printed circuit board is heated at 215° C., for example, in an oven to solder the circuit elements.

Figure 5C:
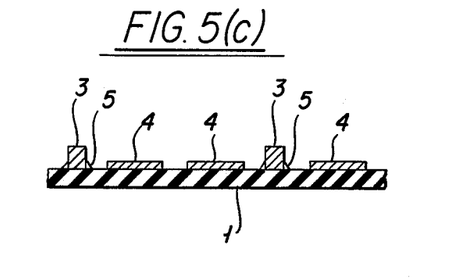

Successively, as shown in FIG. 5(c), patterns 4 of a second solder paste which has relatively low melting point of 117° C., for example, are formed at portions where second electronic components which can not be heated up to so high temperature such as chips of semiconductor devices, are to be soldered. In this case a chalcography printing, for example is applicable.

Figure 5D:
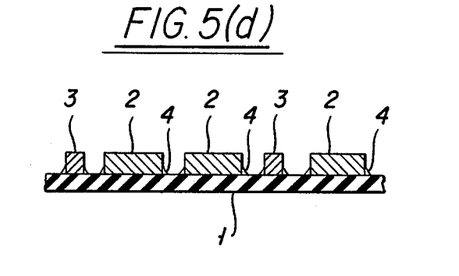

Then, the second electronic components 2 are placed on respective position by loading machine. And the printed circuit board is again heated in an oven at relatively low temperature, 155° C. for example, and the second electronic components 2 are soldered as shown in FIG. 5(d). In this process, the first electronic components 3 which are soldered previously, are not harmed, because the melting point of the solder for them is higher than that of the second electronic components.

In such a manner, the printed circuit board is completed. In the above description, the silk screen printing and chalcography printing are used for forming the patterns of first and second solder paste. They are all conventional ones in the art. It will be obvious that any other patterning method such as thin film circuit technology can be applied to form the solder paste pattern.

The materials used in the embodiments, such as hydrogen chloride in amine hydrogen chloride activator may be replaced with any similar materials such as hydrogen bromide etc. The embodiments, disclosed above are, therefore, to be considered in all respects as illustrative and not restrictive. The essential feature of the present invention is to use a solder paste which comprises azobis as a free radical generator in the flux.

As have been described above, by the use of the solder paste of the present invention, it becomes very easy to solder electronic components onto the printed circuit board. In the description of above step soldering, only two kind of solder pastes are used. But it will be apparent, any other kinds of solder paste having proper melting point for the component to be soldered can be used. The application of the solder paste of the present invention is not limited to printed circuit board, and the method of painting the solder paste on the soldering region is also not limited to the silk screen printing, but it can be used for various painting method including painting by brush. The heating method for soldering may be modified in various way, such as dip soldering and vapor phase soldering which immerses the circuit board into fluorocarbon gas heated up to proper temperature. What is claimed are as follows.

I claim:

1. A method for soldering electronic components onto a printed circuit board, said method comprising the steps of:
    providing soldering flux comprising an azobis compound as a radical generator;
    providing solder alloy powder having a melting point;
    providing a solder paste by kneading said soldering flux and said solder alloy powder;
    designating a soldering region, on which the electronic components are to be soldered, on a surface of the printed circuit board;
    painting said solder paste on said soldering region for providing a painted paste region;
    setting the electronic components on said painted paste region;
    raising a temperature of said painted paste region and the electronic components to a temperature exceeding said melting point; and
    keeping said raised temperature until the electronic components are soldered onto the soldering region.

2. A method according to claim 1, wherein said azobis compound is 1,1'-azobis(cyclohexane-1-carbonitrile) of which content in total weight of said soldering flux is 1 to 20 in weight percent, and said soldering flux further comprises water-white rosin of 45 to 75, hardened caster oil of less than 5, diethylamine hydrogen halide of less than 3 and carbitor of 15 to 55 in weight percents, respectively.

3. A method according to claim 1, wherein said solder alloy powder comprises powder of tin-lead alloy composed of 62 weight percent tin and 38 weight percent lead, having mesh of from 200 to 325 and the melting point of 183° C.

4. A method according to claim 1, wherein said solder alloy powder comprises powder of indium-lead alloy, composed of 52 weight percent indium and 48 weight percent lead, having mesh of from 200 to 325 and the melting point of 117° C.

5. A method according to claim 1, wherein said solder paste comprises said solder alloy powder of 85 to 90 weight percents in total of said solder paste.

6. A method according to claim 1, wherein said painting comprises a silk screen printing.

7. A method for soldering electronic components, belonged to a first group and a second group, onto a printed circuit board, said method comprising the steps of:
    providing soldering flux comprising an azobis compound as a radical generator;
    providing first solder alloy powder having a first melting point;
    providing second solder alloy powder having a second melting point lower than the first melting point;
    providing a first solder paste by kneading said soldering flux and said first solder alloy powder;
    providing a second solder paste by kneading said soldering flux and said second solder alloy powder;
    designating a soldering region on a surface of the printed circuit board, by separating said soldering region into a first soldering region on which the electronic components of the first group are to be soldered and a second soldering region on which the electronic components of the second group are to be soldered;
    firstly painting said first solder paste on said first soldering region at a normal temperature for providing a first painted paste region;
    setting the electronic components of the first group on said first painted paste region;
    firstly raising a temperature of said first painted paste region and the electronic components of the first group up to a temperature exceeding the first melting point from the normal temperature;
    keeping said firstly raised temperature until the electronic components of the first group are soldered onto the first soldering region;
    lowering said firstly raised temperature down to the normal temperature;
    secondly painting said second solder paste on said second soldering region at a normal temperature for providing a second painted paste region;
    setting the electronic components of the second group on said second painted paste region;
    secondly raising a temperature of said second painted paste region and the electronic components of the second group up to a temperature exceeding the second melting point from the normal temperature;
    keeping said secondly raised temperature until the electronic components of the second group are soldered onto the second soldering region; and
    lowering said secondly raised temperature down to the normal temperature.

8. A method according to claim 7, wherein said azobis compound is 1,1'-azobis(cyclohexane-1-carbonitrile) of which content in total weight of said soldering flux is 1 to 20 in weight percent, and said soldering flux further comprises water-white rosin of 45 to 75, hardened caster oil of less than 5, diethylamine hydrogen halide of less than 3 and carbitor of 15 to 55 in weight percents, respectively.

9. A method according to claim 7, wherein said first solder alloy powder comprises powder of tin-lead alloy, composed of 62 weight percent tin and 38 weight percent lead, having mesh of from 200 to 325 and the first melting point of 183° C.

10. A method according to claim 7, wherein said second solder alloy powder comprises powder of indium-lead alloy, composed of 52 weight percent indium and 48 weight percent lead, having mesh of from 200 to 325 and the second melting point of 117° C.

11. A method according to claim 7, wherein said solder paste comprises said solder alloy powder of 85 to 90 weight percents in total of said solder paste.

12. A method according to claim 7, wherein said first painting comprises a silk screen printing.

13. A method according to claim 7, wherein said second painting comprises a chalcography printing.

14. A method for soldering an electronic component onto a substrate body, said method comprising the steps of:

preparing solder paste comprising solder flux and metal powder, said solder flux including amine hydrogen halide as an activator and azobis compound as a free radical generator, printing said solder paste on a metal layer portion of said substrate body, positioning said electronic component in contact with the printed solder paste, and heating at least soldering portion of said metal portion and said electronic component whereby said azobis compound liberates hydrogen halide from said amine hydrogen halide and the liberated hydrogen halide removes oxide film of the soldering surfaces.

15. A method according to claim 14, wherein said azobis compound is 1,1'-azobis(cyclohexane-1-carbonitrile) of which content in total weight of said soldering flux is 1 to 20 in weight percent, and said solder flux further comprises water-white rosin of 45 to 75, hardened caster oil of less than 5, diethylamine hydrogen halide of less than 3 and carbitor of 15 to 55 in weight percents, respectively.

* * * * *